United States Patent
Yoon et al.

(10) Patent No.: US 8,902,666 B2
(45) Date of Patent: Dec. 2, 2014

(54) PROGRAMMING METHOD FOR NONVOLATILE MEMORY DEVICE

(75) Inventors: Sangyong Yoon, Seoul (KR); Kitae Park, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 336 days.

(21) Appl. No.: 13/443,053

(22) Filed: Apr. 10, 2012

(65) Prior Publication Data

US 2012/0269002 A1   Oct. 25, 2012

(30) Foreign Application Priority Data

Apr. 19, 2011  (KR) .................. 10-2011-0036352

(51) Int. Cl.
*G11C 11/34* (2006.01)
*G11C 16/06* (2006.01)
*G11C 16/34* (2006.01)
*G11C 16/10* (2006.01)
*G11C 11/56* (2006.01)

(52) U.S. Cl.
CPC ............ *G11C 16/10* (2013.01); *G11C 16/3454* (2013.01); *G11C 11/5628* (2013.01)
USPC ............ 365/185.22; 365/185.14; 365/185.17; 365/185.24

(58) Field of Classification Search
USPC .............. 365/185.22, 185.14, 185.17, 185.24
See application file for complete search history.

(56) References Cited

U.S. PATENT DOCUMENTS

| | | | |
|---|---|---|---|
| 7,619,920 B2 | 11/2009 | Shiga | |
| 8,238,164 B2 * | 8/2012 | Kim et al. | 365/185.22 |
| 2010/0061148 A1 | 3/2010 | Komatsu | |
| 2010/0254188 A1 | 10/2010 | Ohsuk et al. | |
| 2011/0007571 A1 * | 1/2011 | Park et al. | 365/185.22 |

FOREIGN PATENT DOCUMENTS

| | | |
|---|---|---|
| JP | 2009-016021 | 1/2009 |
| JP | 2010-067291 | 3/2010 |
| KR | 1020100029711 | 3/2010 |
| KR | 1020100111532 | 10/2010 |

* cited by examiner

*Primary Examiner* — Toan Le
(74) *Attorney, Agent, or Firm* — F. Chau & Associates, LLC

(57) ABSTRACT

A method of programming memory cells (transistors) of a nonvolatile memory device from a first set of (previous) logic states to a second set of (final) logic states. The method includes applying program voltages to selected memory transistors; and applying a pre-verification voltage and a target verification voltage for verifying the current logic state of the selected memory transistors. The voltage interval between logic states of the second set of logic states is less than the voltage interval between logic states of the first set of logic states. A target verification voltage for verifying a first memory transistor is at one logic state of the second set is used as a pre-verification voltage for verifying that a second memory transistor to be programmed to higher logic state of the second set.

19 Claims, 12 Drawing Sheets

PROGRAMMING METHOD FOR NONVOLATILE MEMORY DEVICE

CROSS-REFERENCE TO RELATED APPLICATIONS

This application claims the priority, under 35 U.S.C. §119, of Korean Patent Application No. 10-2011-0036352 filed Apr. 19, 2011, the entirety of which is incorporated by reference herein.

TECHNICAL FIELD

Exemplary embodiments relate to a nonvolatile memory device, and more particularly, relate to a method of programming a nonvolatile memory device.

DISCUSSION OF THE RELATED ART

Semiconductor memory devices may be typically classified as volatile memory devices or nonvolatile memory devices. The volatile memory devices lose stored data upon power-off, while the nonvolatile memory devices retain stored data even after power-off. The nonvolatile memory devices may be formed of various types of memory cell transistors. The nonvolatile memory devices may be divided according to structures of memory cell transistors, and include a flash memory device, a ferroelectric random access memory (FRAM) device, a magnetic RAM (MRAM), a phase change RAM (PRAM), and the like.

The flash memory device may be divided into a NOR type flash memory device or a NAND flash memory device according to memory cell interconnection structure. The NOR flash memory devices have a structure that each of memory cell transistors is separately connected to a word line and to a bit line. Accordingly, the NOR flash memory device may have an excellent random access time characteristic. The NAND flash memory devices have the structure that a plurality of memory cell transistors are connected in series to a shared bit line. This structure is called the cell string structure. One cell string requires one bit line contact per NAND string. Accordingly, the NAND flash memory device may have excellent integration and size characteristics.

Memory cells of a flash memory device may be divided into ON cells and OFF cells according to their threshold voltages. An ON cell may be an erased cell, and an OFF cell may be a programmed cell. A memory cell may store at least one bit of data. For example, when storing 1-bit data, a memory cell may be programmed to have one of an erase state and a program state. When storing 2-bit data, a memory cell may be programmed to have one of an erase state and three program states. When storing 3-bit data, a memory cell may be programmed to have one of an erase state and seven program states. Data stored in a memory cell may be read out by sensing its threshold voltage. Each program state will be embodied by a narrow distribution among the cells in that state of threshold voltages of the cells about a nominal threshold voltage corresponding to the state. Various techniques for storing more states and therefore more data per cell have been developed to increase the storage capacity of a flash memory device.

Reduction of read errors and improvement of data storage reliability can be accomplished by forming a fine threshold voltage distribution. In particular, in a multi-level flash memory device which stores multiple bits in each memory cell, memory cells may be programmed to have a fine threshold voltage distribution with a significant read margin between each state.

SUMMARY

One aspect of the inventive concept is directed to provide a method of programming memory cells of a nonvolatile memory device from a first set of (previous) logic states to second set of (current) logic states. The method comprises applying a program voltage to a selected memory cell; and applying a pre-verification voltage and a target verification voltage for verifying the current logic states to the selected memory cell, wherein when an interval between a target verification voltage of a first logic state being one of the current logic states and a target verification voltage of a second logic state being one of the remaining current logic states is less than an interval between a target verification voltage of a third logic state being one of the first set of (previous) logic states and a target verification voltage of a fourth logic state being one of the remaining previous logic states, a target verification voltage for verifying the first logic state is used as a pre-verification voltage for verifying the second logic state.

In this embodiment, if the selected memory cell judged as an ON cell by the pre-verification voltage and as program fail by the target verification voltage then a voltage applied to a bit line of the selected memory cell is adjusted while the program voltage is applied to the selected memory cell.

In this embodiment, a voltage higher than a ground voltage and lower than a program inhibition voltage is applied to the bit line of the selected memory cell.

In this embodiment, the pre-verification voltage is lower than the target verification voltage.

In this embodiment, the second logic state is a program state having a threshold voltage higher than that of the first logic state.

In this embodiment, if the first logic state of the second set is a program state having the lowest positive threshold voltage among the second set of logic states, a pre-verification voltage of the first logic state and a target verification voltage of the first logic state are applied independently to the selected memory cell.

In this embodiment, the applying a program voltage to a selected memory cell and the applying a pre-verification voltage and a target verification voltage for verifying the current logic states to the selected memory cell form a program loop, and the selected memory cell is programmed by repeating the program loop.

In this embodiment, the program voltage increases at each iteration of program loops.

In this embodiment, the method further comprises programming the memory cells to the first set of (previous) logic states, wherein the programming the memory cells to the first set of (previous) logic states comprises applying at least two program voltages to a selected memory cells; and applying a target verification voltage for verifying the logic state of the selected memory cell.

Another aspect of embodiments of the inventive concept is directed to provide a method of programming memory cells of a nonvolatile memory device from logic states of a first (previous) set of logic states to the logic states of a second (current) set of logic states. The method comprises a first program step of programming the memory cells to the logic states of the first (previous) set of logic states; and a second program step of programming the memory cells to the logic states of the second (current) set of logic states. The first program step comprises applying at least first and second program voltages to selected memory cells; and a first verify step of applying to the selected memory cells a first target verification voltage for verifying logic states of the selected memory cells. The second program step comprises applying a third program voltage to a selected memory cell; and a second verify step of applying to the selected memory cell a target verification voltage for verifying a second logic state of the selected memory cell, and wherein the second verify step comprises a step of using the second target verification voltage for verifying a second logic state of the selected memory cell as a pre-verification voltage for verifying a third logic state.

In this embodiment, the first program step comprises a step of applying a first program voltage; and a step of applying a second program voltage.

In this embodiment, the first program voltage is higher than the second program voltage.

In this embodiment, the first logic state is a program state having a threshold voltage lower than that of the second logic state.

In this embodiment, the second program step and the second verify step constitute a program loop, and the selected memory cell is programmed by repeating the program loop.

In this embodiment, a voltage higher than a ground voltage is applied to a bit line of the selected memory cell judged as an ON cell by the pre-verification voltage and as program fail by the target verification voltage at a previous program loop is adjusted while the program voltage is applied to the selected memory cell.

It will be understood that, although the terms first, second, third etc. may be used herein to describe various elements, components, and/or steps, these elements, components, and/or steps should not be limited by these terms. These terms are only used to distinguish one element, component, or step from another. Thus, a first element, component, or step discussed below could be termed a second element, component, or step without departing from the teachings of the inventive concept.

Spatially relative terms, such as "below", "lower", "under", "above", "upper", "positive", "negative" and the like, may be used herein for ease of description to describe one element or feature's relationship to another element(s) or feature(s) as illustrated in the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. As used herein, the term "and/or" includes any and all combinations of one or more of the associated listed items.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

BRIEF DESCRIPTION OF THE FIGURES

The above and other features will become apparent from the following description with reference to the following figures, wherein like reference numerals refer to like parts throughout the various figures unless otherwise specified, and wherein.

DETAILED DESCRIPTION

Figure 1:
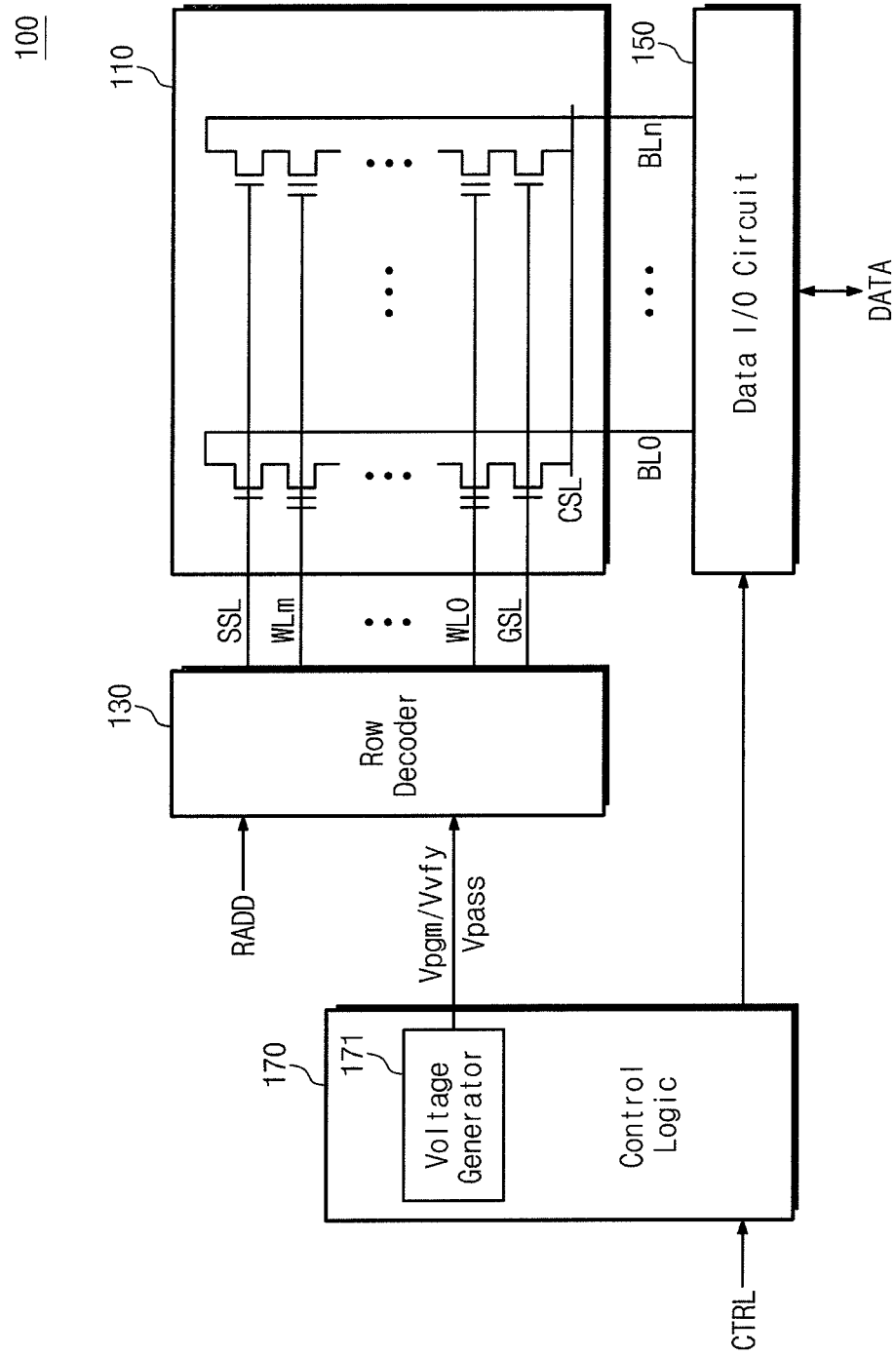
FIG. 1 is a block diagram of a nonvolatile memory device according to an exemplary embodiment of the inventive concept.

FIG. 1 is a block diagram of a nonvolatile memory device according to an exemplary embodiment of the inventive concept. Referring to FIG. 1, the nonvolatile memory device 100 includes a memory cell array 110, a row decoder 130, a data input/output circuit 150, and control logic 170.

The memory cell array 110 includes a plurality of memory cells arranged at intersections of bit lines BL0 to BLn and word lines WL0 to WLm. Each memory cell may store at least one bit of data. For example, each memory cell may store 1-bit data. In various other embodiments, each memory cell may store 2 or more bits of data. Such memory cells are called a multi-level cell (MLC). The MLC may be programmed to have a threshold voltage corresponding to a selected state among an erase state and plural logic states.

The row decoder 130 is configured to select the word lines WL0 to WLm in response to a row address RADD. The row decoder 130 is configured to transfer word line voltages provided from a voltage generator 171 to selected word lines. During programming, the row decoder 130 conducts a program voltage Vpgm to a selected word line and a verification voltage Vvfy to an unselected word line, as received from voltage generator 171 in the control logic 170.

The data input/output circuit 150 operates according to the control of the control logic 170. The data input/output circuit 150 operates as a write driver or a sense amplifier according to the current mode of operation. For example, the data input/output circuit 150 may be configured to write data input via a data input/output buffer (not shown) in the memory cell array 110. While reading, the data input/output circuit 150 may be configured to output data read from the memory cell array 110 via the data input/output buffer. The data input/output circuit 150 may include a plurality of data input/output circuits each connected with the bit lines BL0 to BLn. The bit lines BL0 to BLn may be selected or controlled by the data input/output circuit 150.

The control logic 170 control the overall operation of the nonvolatile memory device 100 in response to a control signal CTRL provided from an external device (e.g., a memory controller, a memory interface, a host device, etc.). For example, the control logic 170 may control read, program (or, write), and erase operations of the nonvolatile memory device 100. This may be accomplished by controlling the voltage generator 171 and the data input/output circuit 150.

While programming, the control logic 170 controls a program operation for applying the selected program voltage Vpgm to a selected memory cell and a program-verify operation for verifying the selected program state of the selected memory cell. The program operation and the program-verify operation may constitute one iteration of a program-verify loop. A selected memory cell may be programmed to have a target logic state via a plurality of program-verify loop iterations. The program voltage Vpgm may increase by a predetermined value at each iteration of program-verify loops. Thus, a program operation may be performed in an incremental step pulse programming (ISPP) manner.

According to an exemplary embodiment of the inventive concept, a selected memory cell is supplied with one program voltage or a plurality of program voltages according to its target logic state. Further, a selected memory cell may be supplied with one program verification voltage or a plurality of program verification voltages according to gaps between target verification voltages of logic states. With this programming scheme, it is possible to form a fine threshold voltage distribution and to improve a programming speed. The program operation according to an exemplary embodiment of the inventive concept will be more fully described with reference to FIGS. 5 to 9.

Figure 2:
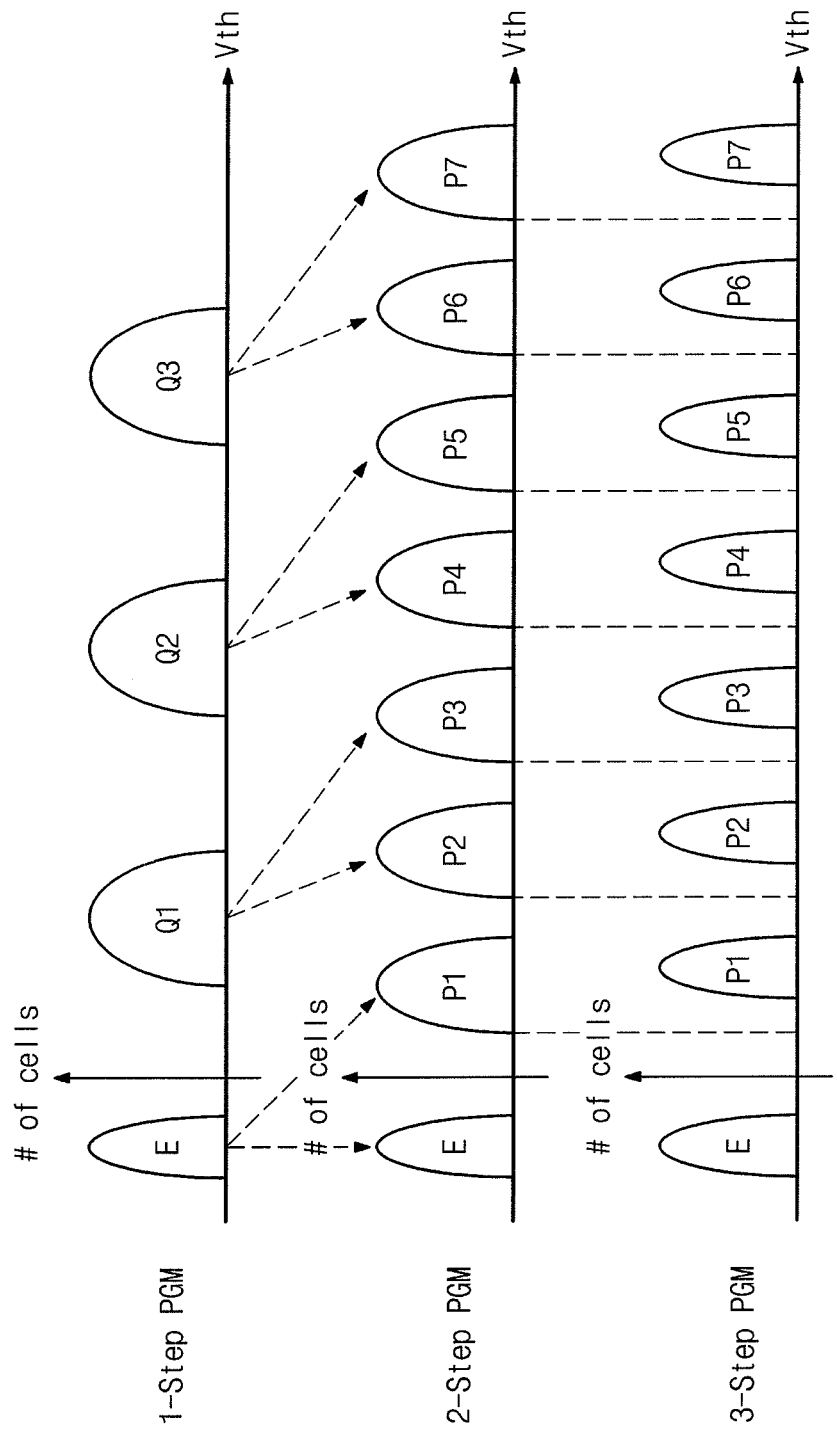
FIG. 2 is a threshold voltage distribution diagram for describing a 3-step program scheme of the device of FIG. 1 according to an exemplary embodiment of the inventive concept.

FIG. 2 is a threshold voltage distribution diagram for describing a 3-step program scheme according to an exemplary embodiment of the inventive concept. Referring to FIGS. 1 and 2, it is assumed that memory cells connected with m word lines WL1 to WLm are multi-level cells each capable of storing 3-bit data. However, the inventive concept is not limited thereto.

If the memory cells connected with the word lines WL1 to WLm store m-bit data, they may be accessed via m storage rows. The storage row may be called a page. With the above assumption, each memory cell may store 3-bit data. In this case, 3-bit data may be stored in memory cells accessed via three page addresses. Thus, first bit data, second bit data, and third bit data may be stored in memory cells accessed via a first page address, a second page address, and a third page address, respectively.

In a first step, 2-page data (i.e., first page data and second page data) may be stored in memory cells of one selected word line. Like threshold voltage distributions of 1-step programming illustrated in FIG. 2, memory cells each having an original threshold voltage corresponding to a logic state E (erased) may be programmed to have a threshold voltage corresponding to any one of a first set of (previous) logic states Q1, Q2, or Q3 (or E) according to data to be programmed. The logic state E may indicate an erase state, and the logic states Q1, Q2, and Q3 may each indicate a different program state.

Next, in a second step, one page of data (i.e., third page data) may be stored in the memory cells of the selected word line. At this time, like threshold voltage distributions corresponding to 2-step programming illustrating in FIG. 2, the memory cells of the selected word line may be programmed from a first set of (previous) logic states E and Q1 to Q3 to a second set of (final) logic states E and P1 to P7.

For example, memory cells each having a threshold voltage corresponding to the logic state E may be programmed to have a threshold voltage corresponding to the final logic state P1 according to data to be programmed; Memory cells having a threshold voltage corresponding to the logic state Q1 may be programmed to have a threshold voltage corresponding to either of the final logic states P2 and P3 according to data to be programmed; Memory cells having a threshold voltage corresponding to the logic state Q2 may be programmed to have a threshold voltage corresponding to either of the final logic states P4 and P5 according to data to be programmed; Memory cells having a threshold voltage corresponding to the logic state Q3 may be programmed to have a threshold voltage corresponding to either of the final logic states P6 and P7 according to data to be programmed.

As a third step, 3-step programming on the memory cells of the selected word line may be made after the 1-step programming and 2-step programming. At this time, like threshold voltage distributions of the 3-step programming illustrated in FIG. 2, the memory cells of the selected word line may be programmed to have threshold voltages corresponding to the respective final logic states E and P1 to P7. Threshold voltage distributions of the memory cells of the selected word line after the 3-step programming may become finer than those after the 2-step programming.

Figure 3:
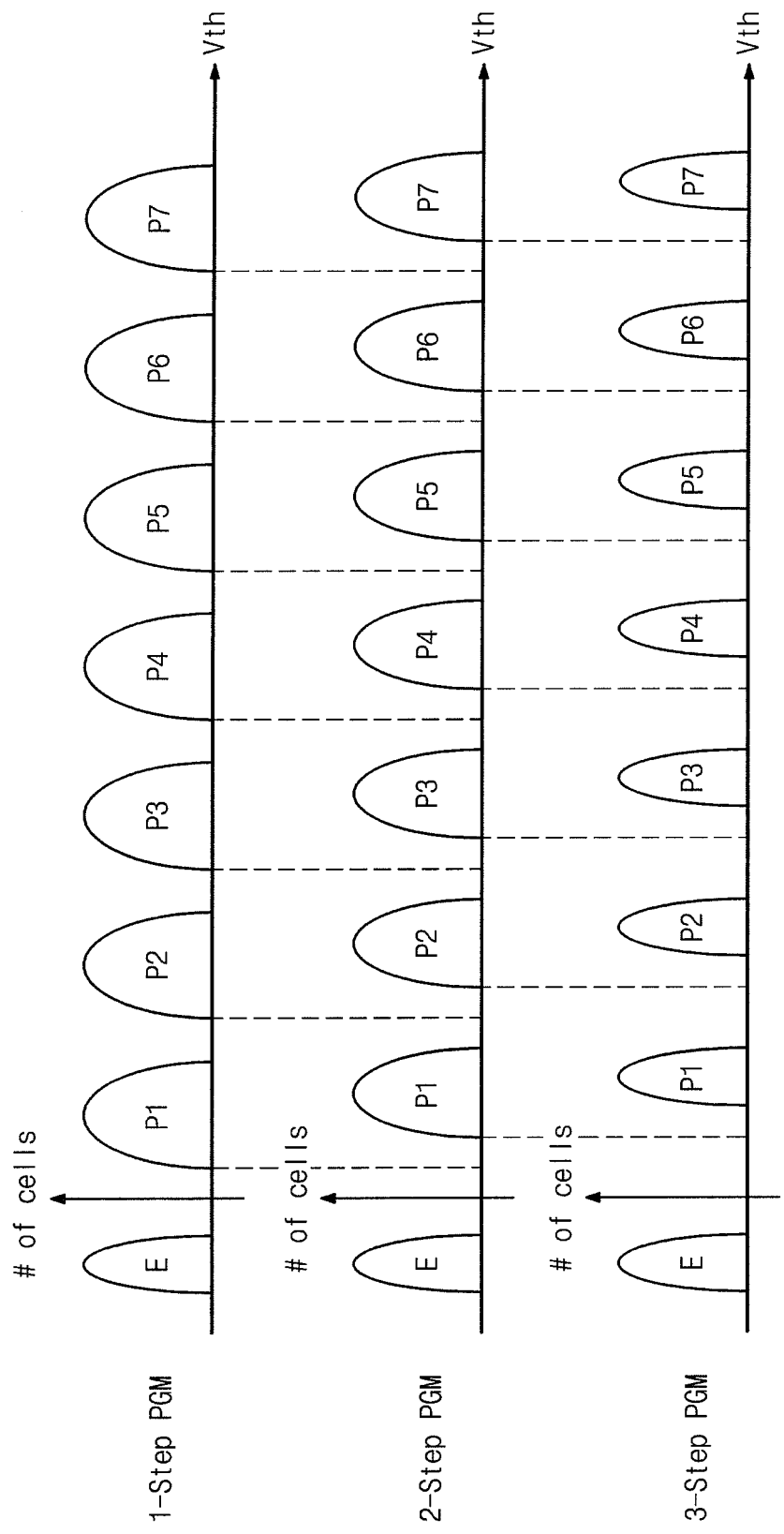
FIG. 3 is a threshold voltage distribution diagram for describing a 3-step programming scheme of the device of FIG. 1 according to another exemplary embodiment of the inventive concept.

FIG. 3 is a diagram for describing a 3-step programming scheme according to another exemplary embodiment of the inventive concept. Referring to FIGS. 1 and 3, it is assumed that memory cells connected with word lines WL1 to WLm are multi-level cells each capable of storing 3-bit data. However, the inventive concept is not limited thereto.

In a first step, three-page data (i.e., first page data, second page data, and third page data) may be stored in the memory cells of a selected word line. At this time, like threshold voltage distributions of 1-step programming illustrated in FIG. 3, the memory cells of the selected word line may be programmed to have threshold voltages corresponding to final logic states E and P1 to P7 according to data to be programmed. The logic state E indicates an erase state, and the logic states P1 to P7 each indicate a different program state.

And then, 2-step programming and 3-step programming may be sequentially performed such that threshold voltage distributions of each of the logic states P1 to P7 become finer. As illustrated in FIG. 3, as the 2-step programming and the 3-step programming are performed sequentially, and threshold voltage distributions of the memory cells of the selected word line may be narrowed increasingly. For example, threshold voltage distributions of the memory cells of the selected word line at the 2-step programming become narrower than those at the 1-step programming. Threshold voltage distributions of the memory cells of the selected word line at the 3-step programming become narrower than those at the 2-step programming.

Figure 4:
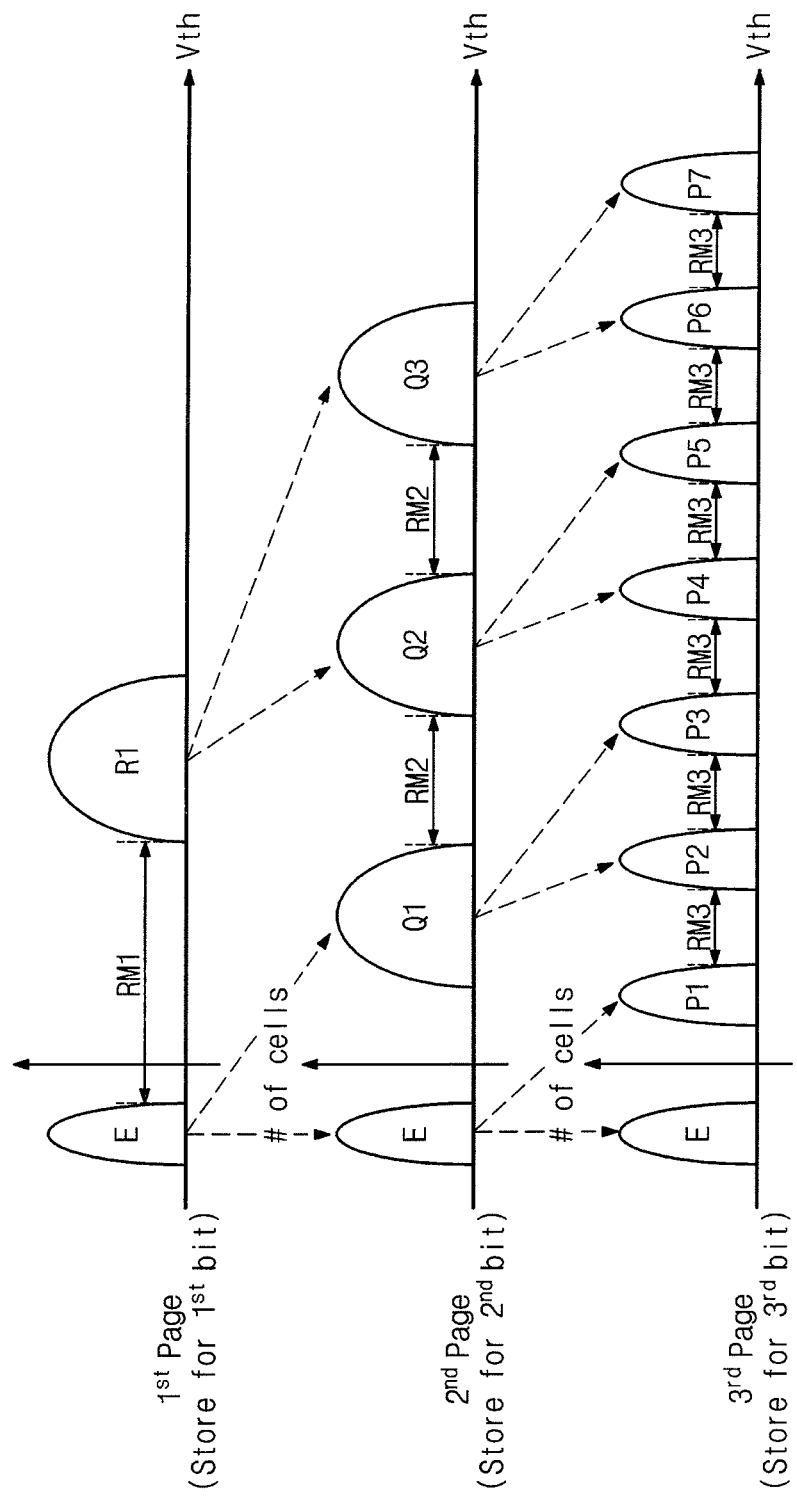
FIG. 4 is a threshold voltage distribution diagram for describing a program method according to a shadow program manner.

FIG. 4 is a diagram for describing a program method according to a shadow program manner. Referring to FIGS. 1 and 4, it is assumed that memory cells connected with word lines WL1 to WLm are multi-level cells each capable of storing 3-bit data. However, the inventive concept is not limited thereto.

Three data bits may be stored in memory cells accessed via three page addresses. Thus, first bit data, second bit data, and third bit data may be stored in memory cells accessed via a first page address, a second page address, and a third page address, respectively.

Before the first bit data is programmed, all memory cells may have a threshold voltage corresponding to a logic state E, respectively. When the first bit data is programmed, the memory cells may be programmed to have a threshold voltage corresponding to one of two logic states E and R1 according to the first bit data. The logic state E may indicate an erase state, and the logic state R1 may indicate a program state.

Before the second bit data is programmed, memory cells may have a threshold voltage corresponding to one of the logic states E and R1, respectively. When the second bit data is programmed, the memory cells may be programmed to have a threshold voltage corresponding to one of four logic states E and Q1 to Q3 according to the second bit data. The logic state E may indicate an erase state, and each of the logic states Q1 to Q3 indicate a different program state.

As illustrated in FIG. 4, memory cells programmed from the logic state E according to the first bit data may have a threshold voltage corresponding to one of logic states E and Q1. Memory cells programmed from the logic state R1 according to the first bit data may have a threshold voltage corresponding to one of logic states Q2 and Q3.

Before the third bit data is programmed, memory cells may have a threshold voltage corresponding to one of the logic state E and Q1 to Q3, respectively. When the third bit data is programmed, the memory cells may be programmed to have a threshold voltage corresponding to one of eight final logic states E and P1 to P7 according to the third bit data. The logic state E may indicate an erase state, and the logic states P1 to P7 each indicate a different program state.

As illustrated in FIG. 4, memory cells programmed from the logic state E according to the first and second bit data may have a threshold voltage corresponding to one of logic states E and P1; Memory cells programmed from the logic state Q1 according to the first and second bit data may have a threshold voltage corresponding to one of logic states P2 and P3; Memory cells programmed from the logic state Q2 according to the first and second bit data may have a threshold voltage corresponding to one of logic states P4 and P5; and Memory cells programmed from the logic state Q3 according to the first and second bit data may have a threshold voltage corresponding to one of logic states P6 and P7.

The greater the number of bits stored in each memory cell, the smaller are the read margins RM1, RM2, and RM3 for judging logic states of memory cells. Thus, the greater the number of bits stored in each memory cell, the narrower are the intervals between logic states. Accordingly, to secure larger read margins RM1, RM2, and RM3, memory cells may be programmed to have finer threshold voltage distributions. Further, the memory cells may be programmed without causing coupling (e.g., the F-poly coupling) between memory cells. Thus, memory cells may be programmed such that a threshold voltage is not varied sharply when a program voltage Vpgm is applied thereto.

Figure 5:
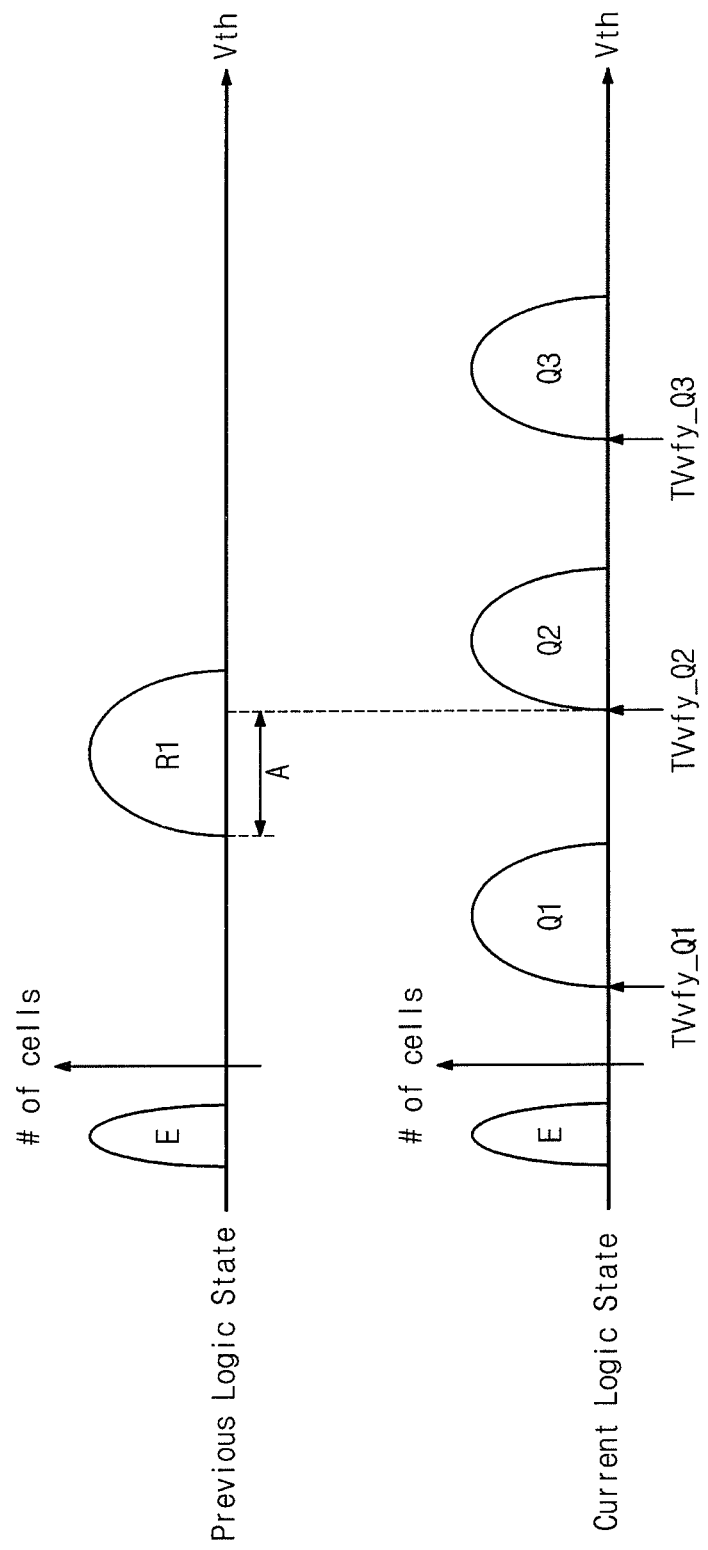
FIG. 5 is a threshold voltage distribution diagram illustrating program verification voltages of a dual pulse program manner according to an exemplary embodiment of the inventive concept.
Figure 6:
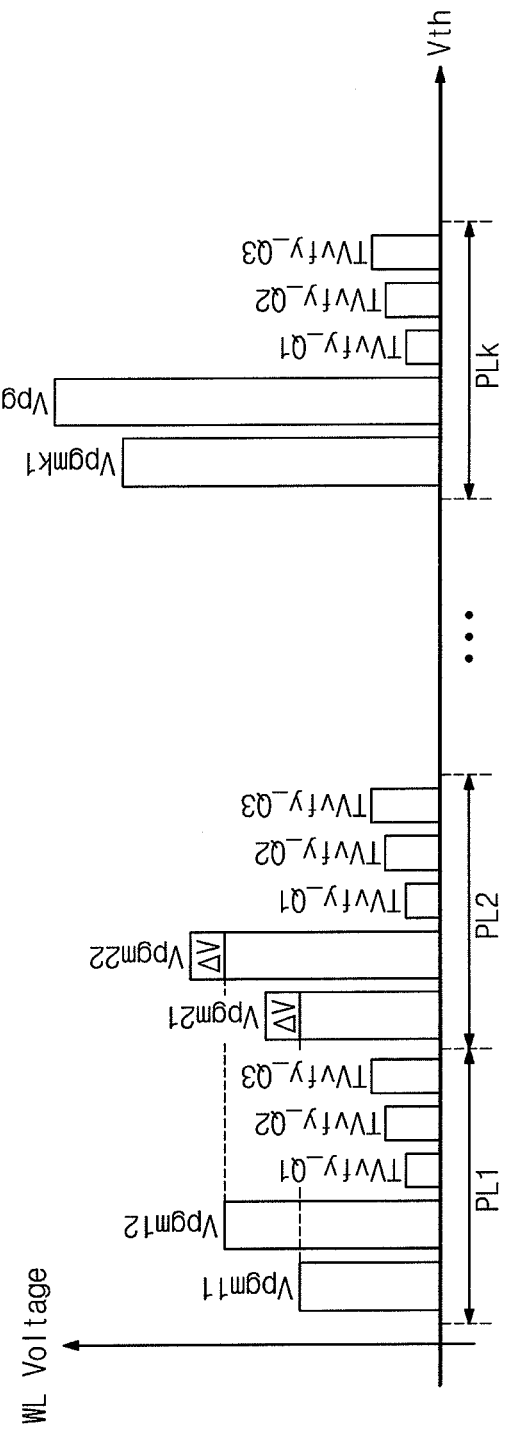
FIG. 6 is a voltage graph illustrating program loops of a dual pulse program manner according to an exemplary embodiment of the inventive concept.

FIG. 5 is a threshold voltage distribution diagram illustrating program verification voltages of a dual pulse program manner according to an exemplary embodiment of the inventive concept. FIG. 6 is a voltage graph illustrating program loops of a dual pulse program manner according to an exemplary embodiment of the inventive concept. In the case of a program operation according to an exemplary embodiment of the inventive concept, a plurality of program voltages are sequentially applied to a selected word line such that no coupling (e.g., the F-poly coupling) is caused between memory cells. This program manner may be called a dual pulse program manner.

For convenience of description, there is exemplarily described a dual pulse program method using the shadow program manner described in FIG. 4.

Referring to FIGS. 5 and 6, a program operation may include a plurality of k program loops PL1 to PLk. Whenever a program loop is repeated, the applied program voltage Vpgm may increase by increment $\Delta V$. Thus, as described above, the program operation may be performed according to an ISPP scheme. In an exemplary embodiment, a first i-th program voltage Vpgmi1 (i=1 to k) may increase by first increment $\Delta V1$ at iteration of program loops, and a second i-th program voltage Vpgmi2 may increase by second increment $\Delta V2$ at iteration of program loops. The first increment $\Delta V1$ may be identical to or different from the second increment $\Delta V2$.

At least two program voltages may be applied at different times to a selected word line to program its memory cells from previous logic states E and R1 to current logic states E and Q1 to Q3. At a first program loop PL1, first and second program voltages Vpgm11 and Vpgm12 may be applied to the selected word line to program second bit data. The first program voltage Vpgm11 is a voltage for programming memory cells having a logic state E corresponding to first bit data. The second program voltage Vpgm12 is a voltage for programming memory cells already having a logic state R1 corresponding to the first bit data.

After the first and second program voltages Vpgm11 and Vpgm12 are applied to the selected word line, a program-verify operation may be performed using program verification voltages TVvfy_Q1, TVvfy_Q2, and TVvfy_Q3. The program verification voltages TVvfy_Q1, TVvfy_Q2, and TVvfy_Q3 are read voltages applied for judging whether memory cells are programmed to logic states Q1, Q2, or Q3, for example, for judging program pass or program fail. Below, the program verification voltages may be called a 'target verification voltage', respectively.

The target verification voltage TVvfy_Q1 is used to judge program pass/fail of memory cells to be programmed to the logic state Q1. The target verification voltage TVvfy_Q2 is used to judge program pass/fail of memory cells to be programmed to the logic state Q2. The target verification voltage TVvfy_Q3 is used to judge program pass/fail of memory cells to be programmed to the logic state Q3.

The k program loops PL1 to PLk may be repeated until memory cells connected with the selected word line are all programmed (i.e., they all are program passed) or until a program loop is performed by a predetermined program loop number (failed).

In case of the dual pulse program scheme according to an exemplary embodiment of the inventive concept, the variation of threshold voltages of memory cells programmed from the logic state E corresponding to the first bit data may be similar to those programmed from the logic state R1 corresponding to the first bit data. Programming of memory cells to the logic state Q1 and programming of memory cells to the logic states Q2 and Q3 is preferably completed the same time. This means that the coupling between memory cells is reduced.

In memory cells programmed from the of region A (shown) in FIG. 5 of logic state R1 corresponding to the first bit data, a positive voltage may be applied to bit lines of memory cells to be programmed to the logic state Q2. Thus, memory cells to be programmed to the logic state Q2 may be programmed using a bit line forcing program technique. This will be more fully described with reference to FIG. 7.

Figure 7:
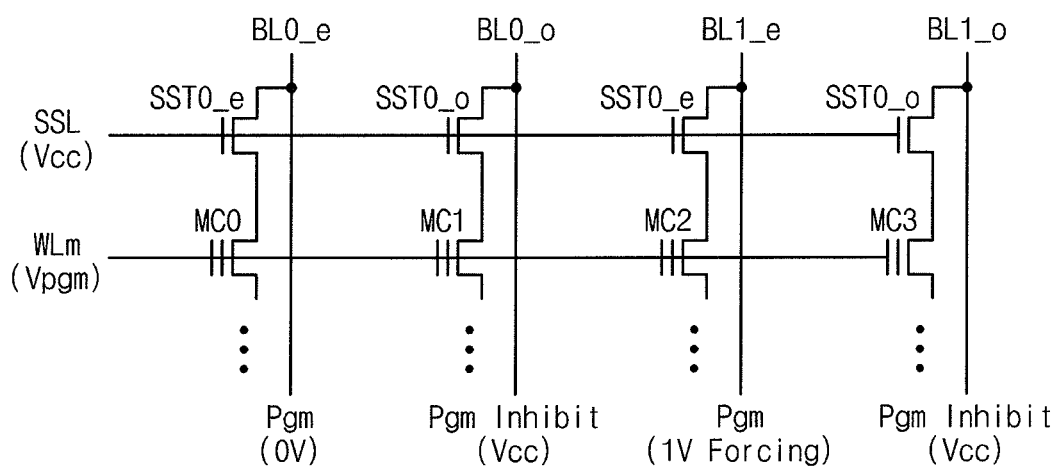
FIG. 7 is a circuit diagram of a portion of the memory cell array 110 in FIG. 1 for describing a bit line forcing programming method.

FIG. 7 is a circuit diagram of a portion of the memory cell array 110 in FIG. 1 for describing a bit line forcing programming method. Referring to FIG. 7, for convenience of description, there is exemplarily illustrated four memory cells MC0 to MC3 arranged at the intersections of bit lines BL0 and BL1 and a word line WLm.

A exemplarily bias condition for programming even-numbered NAND strings is shown in FIG. 7. Upon programming of an even-numbered page, a power supply voltage Vcc is applied to odd bit lines BL0_o and BL1_o corresponding to an odd-numbered page so as to be program inhibited. According to the bias condition in FIG. 7, gate-source voltages Vgs of selection transistors SST0_o and SST1_o may be lower than their threshold voltages, so that the selection transistors SST0_o and SST1_o are turned OFF despite voltage Vcc being applied to the string select line SSL. This means that channels of memory cell strings connected with the bit lines BL0_o and BL1_o supplied with the power supply voltage Vcc are floated. Potentials of the floated channels are boosted by the coupling effect. This makes the F-N tunneling of memory cells MC1 and MC3 be inhibited. Thus, the memory cells MC1 and MC3 are not programmed despite program voltage Vpgm being applied to the word line WLm.

A voltage suitable to generate the F-N tunneling is applied to even bit lines BL0_e and BL1_e corresponding to the even-numbered NAND strings. Thus, a ground voltage (0V) may be applied to the bit line BL0_e, and a bit line forcing voltage may be applied to the bit line BL1_e. Exemplarily, a voltage of 1V may be applied to the bit line BL1_e as the bit line forcing voltage. The bit line forcing voltage may be higher than the ground voltage and lower than a program inhibition voltage.

The F-N tunneling may thus be generated between gates and channels of the memory cells MC0 and MC2 due to voltages applied to the bit lines BL0_e and BL1_e and due to program voltage Vpgm applied to the word line WLm. Thus, the memory cells MC0 and MC3 are programmed. The potential (voltage) difference between the gate and the channel of the memory cell transistor MC2 is lower than that of the memory cell MC0 due to the bit line forcing voltage (1V) applied to the bit line BL0_e. The magnitude of the F-N tunneling generated between the gate and channel of the memory cell MC2 may be less than that of the memory cell MC0. The F-N tunneling generated between the gate and channel of the memory cell MC2 may be controlled according to the bit line forcing voltage (1V) applied to the bit line BL0_e, so that a threshold voltage shift of the memory cell MC2 is less than that of the memory cell MC0. This causes a finer threshold voltage distribution to be formed.

Figure 8:
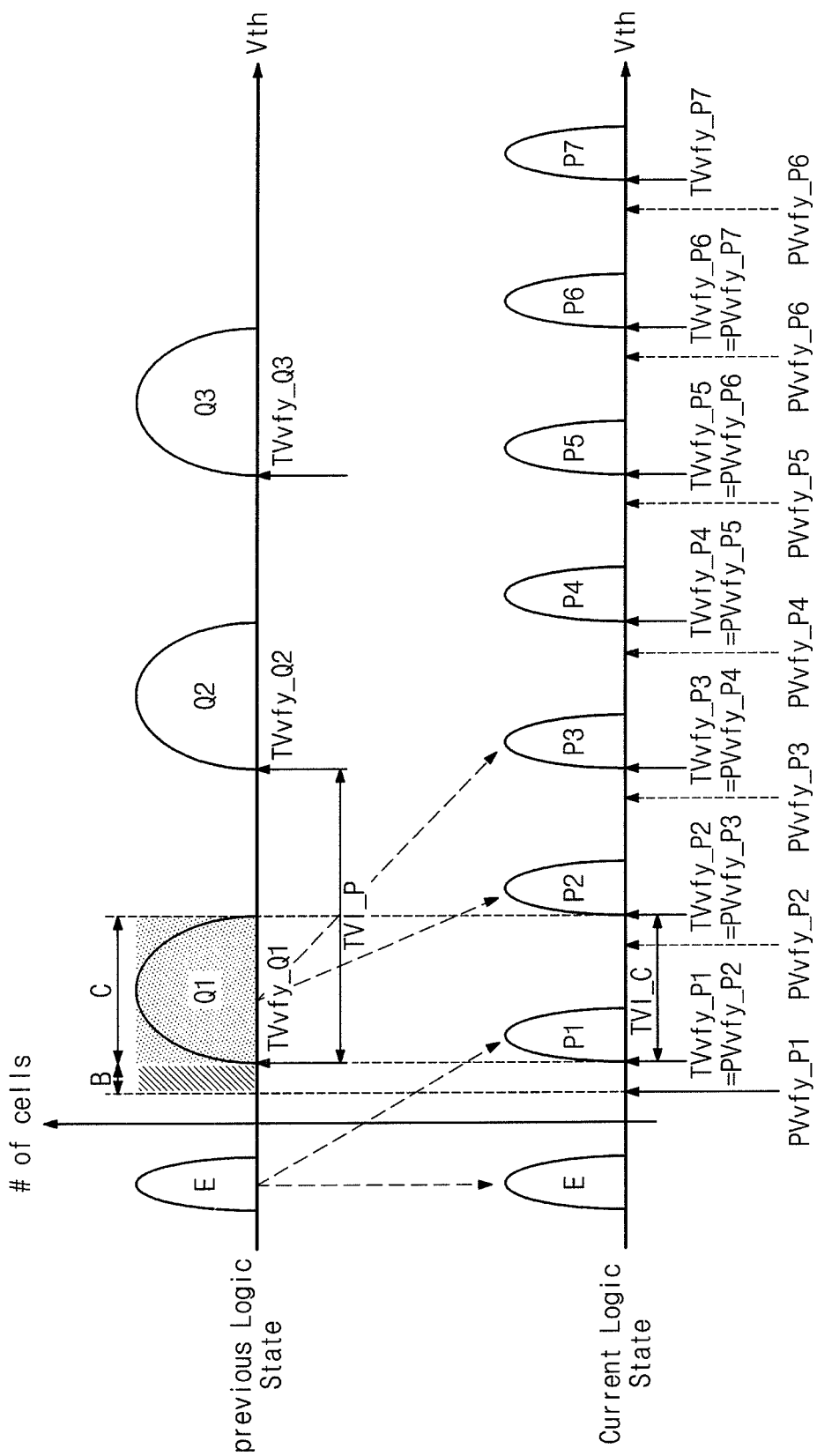
FIG. 8 is a threshold voltage distribution diagram illustrating program verification voltages of a skip program-verify manner according to an exemplary embodiment of the inventive concept.
Figure 9:
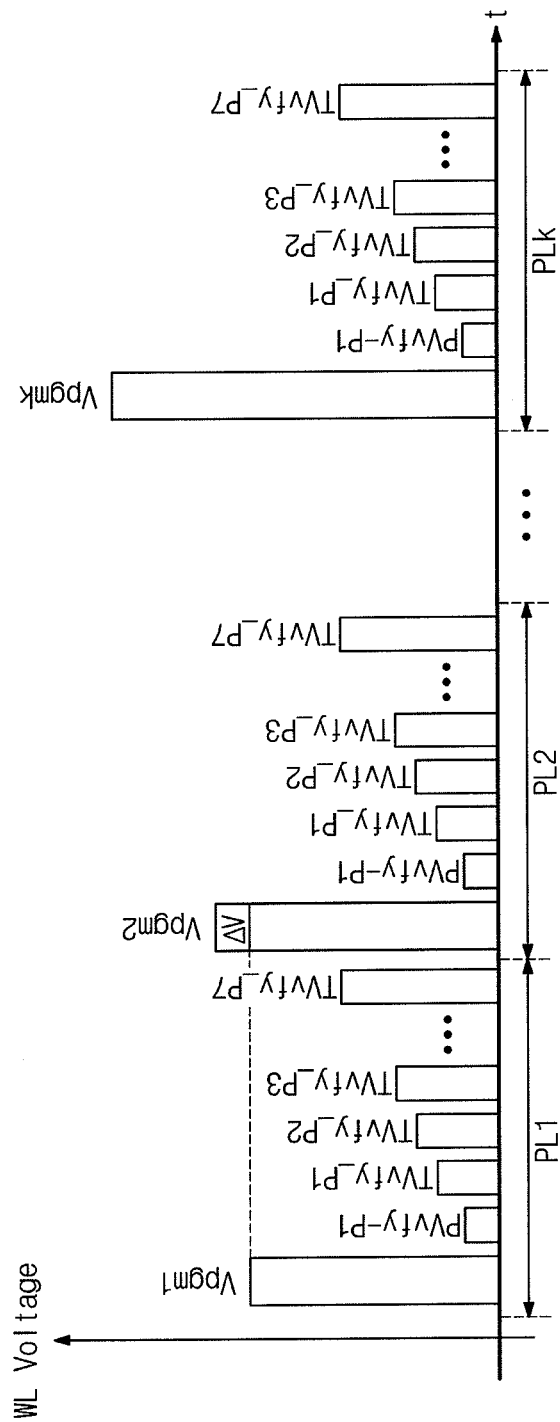
FIG. 9 is a voltage graph illustrating program loops of a skip program-verify manner according to an exemplary embodiment of the inventive concept.

FIG. 8 is a threshold voltage distribution diagram illustrating program verification voltages of a skip program-verify manner according to an exemplary embodiment of the inventive concept. FIG. 9 is a voltage graph illustrating program loops of a skip program-verify manner according to an exemplary embodiment of the inventive concept.

In the case of a program operation according to an exemplary embodiment of the inventive concept, a pre-verification voltage PVvfy and a target verification voltage TVvfy are applied to the selected word line to form fine threshold voltage distributions. The target verification voltage TVvfy of a first logic state may be used as a pre-verification voltage PVvfy of a second logic state to improve program speed. Herein, the threshold voltage distribution of the first logic state may be lower than that of the second logic state.

The program-verify method may be called a skip program-verify method. A program-verify operation using the pre-verification voltage PVvfy may be called a pre-verify operation, and a program-verify operation using the target verification voltage TVvfy may be called a target verify operation.

For convenience of description, there is exemplarily described a skip program-verify method using a shadow program manner described in FIG. 4.

Referring to FIGS. 8 and 9, a program operation may include a plurality of program loops PL1 to PLk. Whenever a program loop is repeated, a program voltage Vpgm may increase by increment ΔV. Thus, as described above, the program operation of each memory cell may be performed according to an ISPP scheme.

To program memory cells from previous logic states E and Q1 to Q3 to current logic states E and P1 to P7, a program voltage Vpgm may be applied to a selected word line, and then a pre-verification voltage PVvfy and a target verification voltage TVvfy may be applied thereto. The pre-verification voltage PVvfy may be a voltage for judging the threshold voltage of memory cells to be programmed in the above-described bit line forcing program manner. The target verification voltage TVvfy may be a voltage for judging whether memory cells are programmed to logic states P1 to P7, for example, whether they are program passed or failed.

Referring to FIG. 8, a pre-verification voltage PVvfy_P1 may be used to judge the threshold voltages of memory cells to be programmed from the logic state E to the logic state P1 via the bit line forcing program manner among memory cells programmed according to first and second bit data. Thus, the pre-verification voltage PVvfy_P1 may be used to judge the threshold voltages (i.e., program pass/fail) of memory cells (i.e., memory cells included within region B in FIG. 8) having a threshold voltage higher than the pre-verification voltage PVvfy_P1 and lower than the target verification voltage TVvfy_P1, among memory cells programmed from the logic state E. Memory cells (i.e., memory cells included within a region B in FIG. 8) judged as an ON cell by the pre-verification voltage PVvfy_P1 may be programmed via the bit line forcing program manner to form a finer threshold voltage distribution. The target verification voltage TVvfy_P1 may be used to judge program pass/fail of memory cells programmed to the logic state P1.

Further, the target verification voltage TVvfy_P1 may be used to judge memory cells to be programmed to the logic state P2 via the bit line forcing program manner among memory cells programmed from the logic state Q1 according to the first and second bit data. Thus, the target verification voltage TVvfy_P1 may be used to judge memory cells (i.e., memory cells included within a region C in FIG. 8) having a threshold voltage higher than the target verification voltage TVvfy_P1 and lower than the target verification voltage TVvfy_P2, among memory cells programmed from the logic state Q1. Memory cells (i.e., memory cells included within a region C in FIG. 8) judged as an ON cell by the target verification voltage TVvfy_P1 may be programmed via the bit line forcing program manner to form a finer threshold voltage distribution. The target verification voltage TVvfy_P2 may be used to judge program pass/fail of memory cells programmed to the logic state P2.

Further, the target verification voltage TVvfy_P2 may be used to judge memory cells to be programmed from the logic state Q1 to the logic state P3 via the bit line forcing program manner among memory cells programmed according to the first and second bit data. In this manner, the target verification voltage TVvfy_P3 may be used to judge memory cells to be programmed to the logic state P4 via the bit line forcing program manner, and the target verification voltage TVvfy_P4 may be used to judge memory cells to be programmed to the logic state P5 via the bit line forcing program manner. Further, the target verification voltage TVvfy_P5 may be used to judge memory cells to be programmed to the logic state P6 via the bit line forcing program manner, and the target verification voltage TVvfy_P6 may be used to judge memory cells to be programmed to the logic state P7 via the bit line forcing program manner.

A program operation may be performed using, as a pre-verification voltage of a target logic state, a target verification voltage for verifying of a logic state having a threshold voltage lower than the target logic state. Accordingly, by using an applied voltage for more than one purpose it is possible to improve the programming speed.

According to an exemplary embodiment of the inventive concept, a skip program-verify method may be selectively used as a program-verify method according to intervals among target verification voltages of previous logic states and intervals of target verification voltages of current logic states.

In particular, referring to FIG. 8, it is assumed that voltage intervals between target verification voltages TVvfy_Q1, TVvfy_Q2 and TVvfy_Q3 of previous logic states are a first interval TVI_P. For convenience of illustration, the interval between target verification voltages TVvfy_Q1 and TVvfy_Q2 of previous logic states Q1 and Q2 is exemplarily shown as the first interval TVI_P. However, it is well understood that the interval between target verification voltages TVvfy_Q2 and TVvfy_Q3 of previous logic states Q2 and Q3 is preferably the same as the first interval TVI_P. Further, it is assumed that the intervals between target verification voltages TVvfy_P1 to TVvfy_P7 of current logic states are a second voltage interval TVI_C. For convenience of illustration, the interval between target verification voltages TVvfy_P1 and TVvfy_P2 of current logic states P1 and P2 is exemplarily shown as the second interval TVI_C. However, it is well understood that the intervals between target verification voltages TVvfy_P2 to TVvfy_P7 of current logic states P2 to P7 are preferably identical the same as the second interval TVI_C. According to an exemplary embodiment of the inventive concept, the skip program-verify method may be used as a program-verify method only when the second interval TVI_C is less than the first interval TVI_P. In the event that a target program state is a current logic state P1, a pre-verification voltage PVvfy_P1 and a target verification voltage TVvfy_P1 may be applied independently to a selected word line.

FIGS. 8 and 9 were described under the assumption that a skip program-verify manner is applied to memory cells programmed in a shadow program manner described in FIG. 4. However, it is well understood that a skip program-verify manner is applied to memory cells programmed in a 3-step program manner described in FIGS. 2 and 3.

Figure 10:
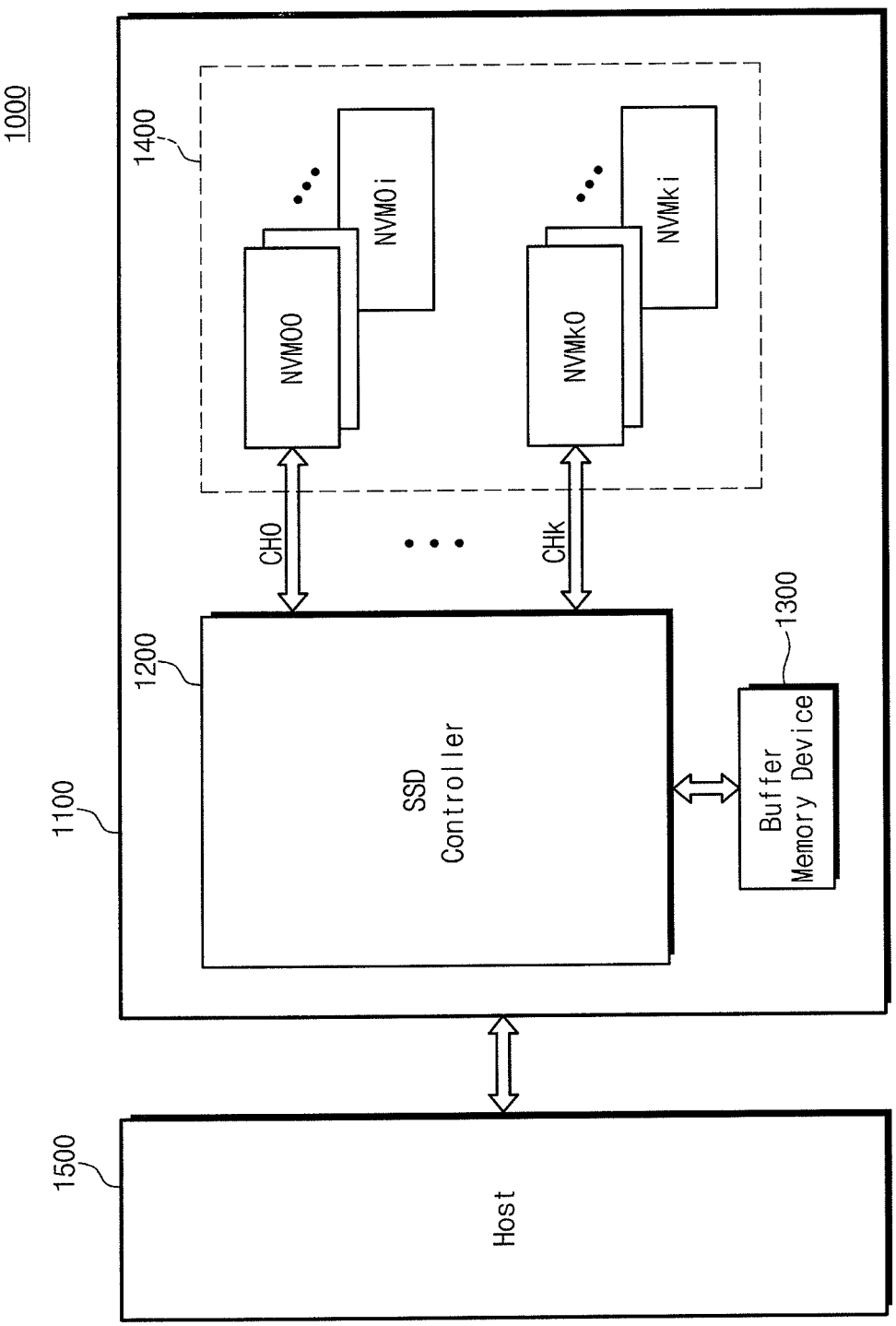
FIG. 10 is a block diagram of a data processing system including a nonvolatile memory device according to an exemplary embodiment of the inventive concept.

FIG. 10 is a block diagram of a data processing system including a nonvolatile memory device according to an exemplary embodiment of the inventive concept.

Referring to FIG. 10, a data processing system 1000 includes a data storage device 1100 and a host device 1500. The data storage device 1100 may be a solid state drive (hereinafter, referred to as SSD). The SSD 1100 includes an SSD controller 1200, a buffer memory device 1300, and a storage medium 1400. The SSD 1100 according to an exemplary embodiment of the inventive concept may further include a temporary power supply circuit having super capacitors (not shown). The temporary power supply circuit may power the SSD 1100 at sudden power-off such that a critical shut-down operation of the SSD 1100 may be ended normally.

The SSD 1100 may operate responsive to an access request of the host 1500. Thus, the SSD controller 1200 may respond to a request from the host 1500 to access the storage medium 1400. For example, the SSD controller 1200 may be configured to control read, write, and erase operations of the storage medium 1400. The buffer memory device 1300 may temporarily store data to be stored in the storage medium 1400. Further, the buffer memory device 1300 may temporarily store data read out from the storage medium 1400. Data stored in the buffer memory device 1300 may be transferred to the storage medium 1400 or the host 1500 according to the control of the SSD controller 1200.

The SSD controller 1200 may be connected with the storage medium 1400 via a plurality of channels CH0 to CHk, each of which is connected with a plurality of i*k non-volatile memory devices (NVM00 to NVM0i) to (NVMk0 to NVMki). The storage medium 1400 may be formed of a NAND flash memory device according to any exemplary embodiment of the inventive concept described herein above. Accordingly, the data reliability of the SSD 1100 may be improved, and the operating speed (e.g., a program speed) may be also improved.

Figure 11:
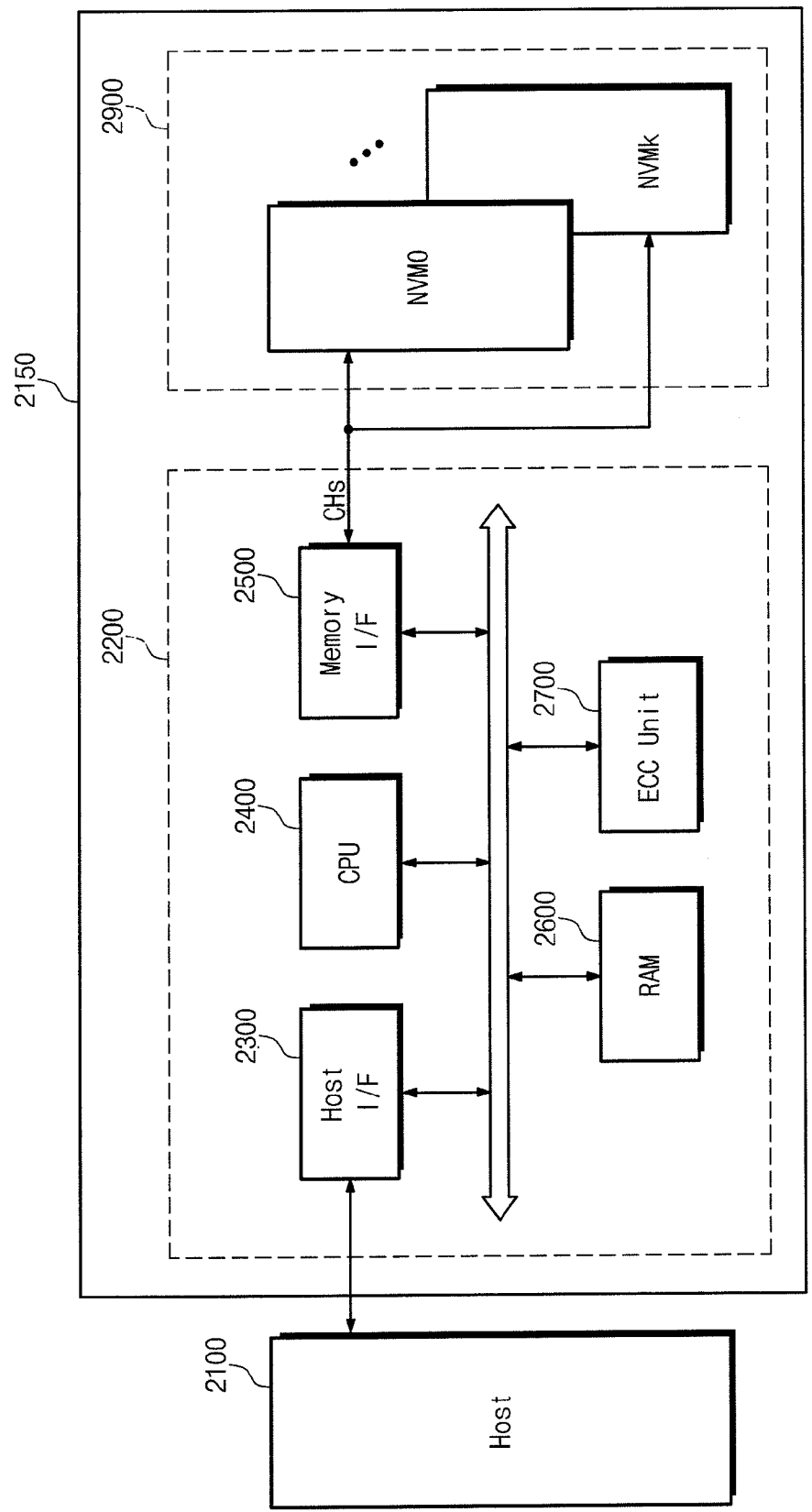
FIG. 11 is a block diagram of another data processing system including a nonvolatile memory device according to an exemplary embodiment of the inventive concept.

FIG. 11 is a block diagram of another data processing system including a nonvolatile memory device according to an exemplary embodiment of the inventive concept.

Referring to FIG. 11, a data processing system 2000 may include a host device 2100 and a data storage device 2150. The data storage device 2150 may include a controller 2200 and a data storage medium 2900 formed of a plurality of data storage devices.

The controller 2200 may be connected between the host 2100 and the data storage medium 2900. The controller 2200 may respond to a request of the host 2100 to access the data storage media 2900. For example, the controller 2200 may be configured to control read, write, and erase operations of the data storage media 2900. The controller 2200 is configured to provide an interface between the data storage media 2900 and the host 2100. The controller 2200 is configured to execute firmware for controlling the data storage media 2900.

The controller 2200 may include constituent elements such as a host interface 2300, a CPU 2400, a memory interface 2500, a RAM 2600, and an ECC unit 2700. The RAM 2600 may be used as a working memory of the CPU 2400. The CPU 2400 may control the overall operation of the controller 2200.

The host interface 2300 may include a protocol for executing data exchange between the host 2100 and the controller 2200. For example, the memory controller 2200 may be configured to communicate with an external device (for example, a host) through at least one of various interface protocols such as an Universal Serial Bus (USB) protocol, a MultiMedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and the like.

The ECC unit 2700 may be configured to detect an error of data read out from the data storage media 2900 and to correct the detected error. The memory interface 2500 may provide an interface between the data storage medium 2900 and the controller 2200. The data storage medium 2900 may be formed of a nonvolatile memory device according to any exemplary embodiment of the inventive concept described above. Accordingly, the data reliability of the data storage device 2150 may be improved, and the operating speed (e.g., a program speed) may be also improved.

The controller 2200 and the data storage medium 2900 may be integrated in a single semiconductor device to form a memory card such as a PCMCIA (personal computer memory card international association) card, a CF (compact flash) card, a smart media card, a memory stick, a multimedia card (MMC, RS-MMC, MMC-micro), an SD card (SD, Mini-SD, Micro-SD, SDHC), UFS (universal flash storage), and so on.

In some embodiments, the controller 2200 and/or the data storage medium 2900 may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (S SOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 12:
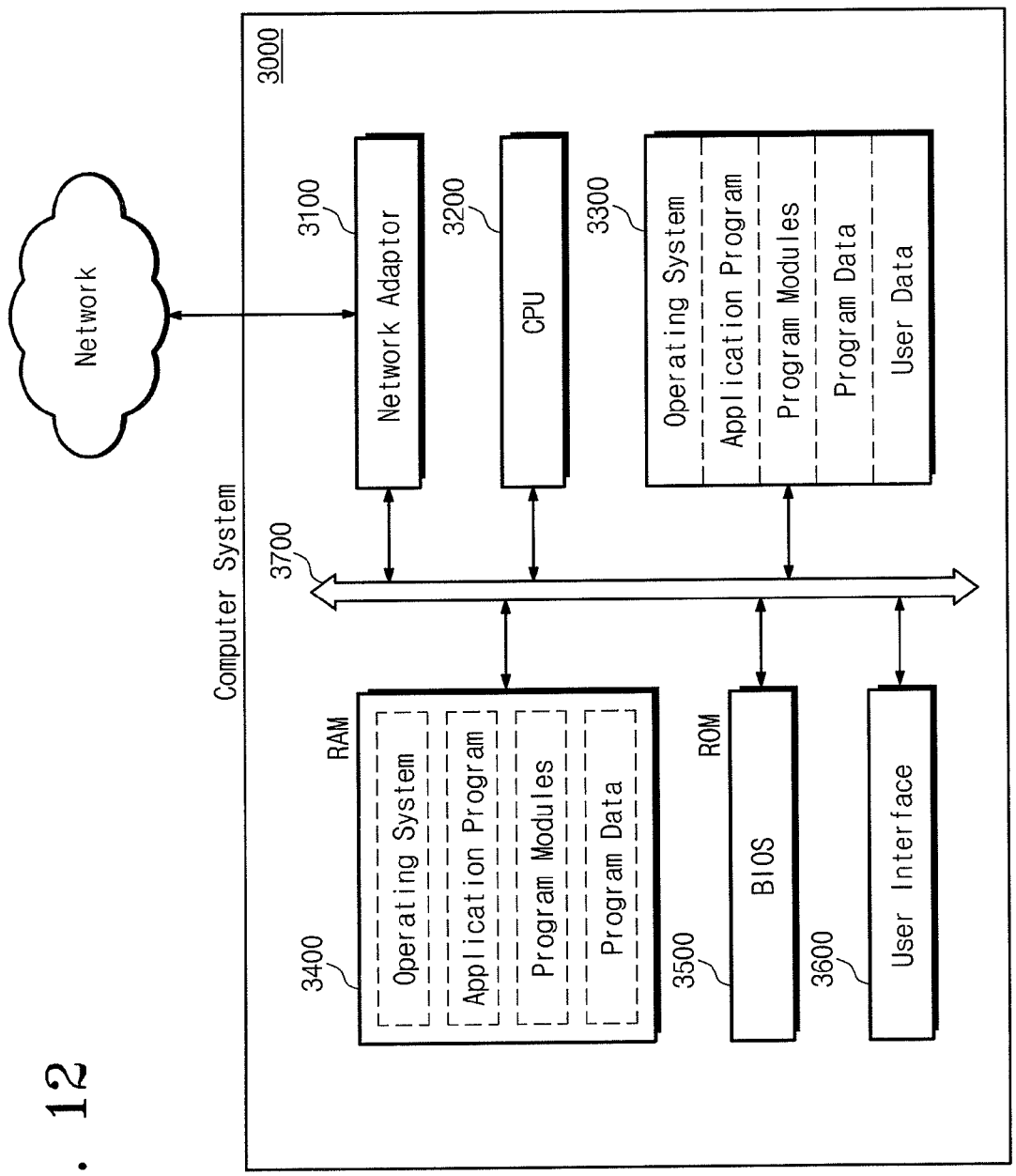
FIG. 12 is a block diagram of a computer system including the data processing system of FIG. 10 or 11.

FIG. 12 is a block diagram illustrating a computer system including the data processing system of FIGS. 10 of 11.

A computer system 3000 may include a network adaptor 3100, a CPU 3200, a data storage device 3300, a RAM 3400, a ROM 3500, and a user interface 3600 which are electrically connected to a system bus 3700. Herein, the data storage device 3300 may be formed of the data processing device 1000 of FIG. 10. Alternatively, the data storage device 3300 may be formed of the data processing system 2000 of FIG. 11.

The network adaptor 3100 may provide an interface between the computer system 3000 and external networks. The CPU 3200 may control the overall operation for executing an operating system and any application programs which are resident on the RAM 3400. The data storage device 3300 may store data needed for the operation of the computer system 3000. For example, the data storage device 3300 may store an operating system for driving the computer system 3000, an application program, various program modules, program data, user data, and the like.

The RAM 3400 may be used as a working memory of the computer system 3000. Upon booting, the operating system, the application program, the various program modules, and program data needed to drive programs and various program modules read out from the data storage device 3300 may be loaded on the RAM 3400. The ROM 3500 may store a basic input/output system (BIOS) which is activated before the operating system is driven upon booting. Information exchange between the computer system 3000 and a user may be made via the user interface 3600.

In addition, the computer system 3000 may further include a battery, a modem, and the like. Although not shown in FIG. 12, the computer system 3000 may further include an application chipset, a camera image processor (CIS), a mobile DRAM, and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of programming memory transistors of a nonvolatile memory device, comprising:
    applying a first program voltage to a first selected memory transistor having its threshold voltage corresponding to a first logic state among a first set of logic states, to program the first selected memory transistor to a second logic state among a second set of logic states;
    applying a first target verification voltage to the first selected memory cell for verifying that the first selected memory transistor is programmed to the second logic state of the second set of logic states while applying the first target verification voltage to a second selected memory transistor as a second pre-verification voltage of the second selected memory transistor;
    applying a second program voltage to the second selected memory transistor having its threshold voltage corresponding to a second logic state among the first set of logic states to program the second selected memory transistor to a third logic state among the second set of logic states; and
    after applying the first target verification voltage to the first selected memory cell, applying a second target verification voltage to the second selected memory transistor for verifying that the second selected memory transistor is programmed to the third logic state of the second set of logic states,
    wherein the second target verification is higher than the first target verification voltage and lower than the threshold voltages corresponding to, the third logic state of the second set of logic states,
    wherein the threshold voltages corresponding to the second logic state of the first set of logic states are higher than the threshold voltages corresponding to the first logic state of the first set of logic states,
    wherein the threshold voltages corresponding to the third logic state of the second set of logic stales are higher than the threshold voltages corresponding to the second logic state of the second set of logic states,
    wherein the pre-verification voltage is lower than the threshold voltages corresponding to the third logic state of the second set of logic states, and
wherein the first target verification voltage is lower than the threshold voltages corresponding to the second logic state of the second set of logic states.

2. The method of claim 1, further comprising:
    applying a first pre-verification voltage to the first and second selected memory transistors,
    wherein the first pre-verification voltage is lower than the threshold voltages corresponding to the second logic state of the first set of logic states and lower than the threshold voltages corresponding to the second logic state of the second set of logic states.

3. The method of claim 2, wherein when the second voltage interval between logic states among the second set of logic states is less than the first voltage interval between logic states among the first set of logic states.

4. The method of claim 2, further comprising,
    if the first selected memory transistor is judged as an ON transistor by the first pre-verification voltage and as program fail by the first target verification voltage, then a voltage applied to the bit line of the first selected memory transistor is adjusted while a program voltage is applied to the first selected memory transistor.

5. The method of claim 4, wherein if the first selected memory transistor is judged as an ON transistor by the first pre-verification voltage and as program fail by the first target verification voltage, then a voltage higher than a ground voltage and lower than a program inhibition voltage is applied to the bit line of the selected memory transistor while a program voltage is applied to the first selected memory transistor.

6. The method of claim 2, wherein the first pre-verification voltage is lower than the first target verification voltage.

7. The method of claim 2, wherein if the second logic state of the second set of logic states is a program state having the lowest positive threshold voltage among the second set of logic states, then a first pre-verification voltage and the first target verification voltage are applied at different times to the first selected memory transistor.

8. The method of claim 2, wherein a first program loop comprises the applying the first program voltage to a first selected memory transistor and the applying the pre-verification voltage and the first target verification voltage to the first selected memory transistor, and wherein the first selected memory transistor is programmed by repeating the first program loop.

9. The method of claim 8, wherein the first program voltage increases with each iteration of the first program loops.

10. The method of claim 1aim 11, wherein the second logic state of the second set of logic states is a program state having a threshold voltage higher than that of the second logic state of the first set of logic states.

11. The method of claim 1, further comprising:
  programming the second selected memory transistor to the second logic state of the first set of logic states, and,
  wherein the programming the second memory transistor to the second logic state of the first set of logic states comprises;
  applying a program voltage to the second selected memory transistor; and
  applying to the second selected memory transistor a target verification voltage for verifying that the second selected memory transistor is programmed to the second logic state of the first set of logic states.

12. A data processing system, comprising a data storage device including a nonvolatile memory device configured to perform the method of claim 1.

13. The data processing system of claim 12, further comprising:
  a solid state drive (SSD) controller connected to a storage medium including the nonvolatile memory device configured to perform the method of programming memory transistors of a nonvolatile memory device, comprising:
  applying a first program voltage to a first selected memory transistor having its threshold voltage corresponding to a first logic state among a first set of logic states, to program the first selected memory transistor to a second logic state among a second set of logic states;
  applying a first target verification voltage to the first selected memory cell for verifying that the first selected memory transistor is programmed to the second logic state of the second set of logic states while applying the first target verification voltage to a second selected memory transistor as a second pre-verification voltage of the second selected memory transistor; and a buffer memory.

14. The data processing system of claim 12, further comprising:
  a controller connected to a storage medium including the nonvolatile memory device configured to perform the method of programming memory transistors of a nonvolatile memory device, comprising:
  applying a first program voltage to a first selected memory transistor having its threshold voltage corresponding to a first logic state among a first set of logic states, to program the first selected memory transistor to a second logic state among a second set of logic states; and
  applying a first target verification voltage to the first selected memory cell for verifying that the first selected memory transistor is programmed to the second logic state of the second set of logic states while applying the first target verification voltage to a second selected memory transistor as a second pre-verification voltage of the second selected memory transistor, wherein the controller is configured to execute firmware for controlling the storage medium, and wherein the controller includes a host interface, a processor, a memory interface, a RAM, and an ECC unit.

15. A method of programming a plurality of memory transistors on a word line of a nonvolatile memory device, comprising:
  programming a third and fourth memory transistors to one logic state of a first set of logic states, including:
  a first program step of applying a first program voltage to the third and fourth memory transistors; and
  a first verify step of applying a first target verification voltage to the third and fourth memory transistors for verifying that the third and fourth memory transistors are programmed to a second logic state of the first set of logic states; and then
  programming a second memory transistor and the third and fourth memory transistors to three logic states of a second set of logic states, including:
  a second program step of applying a second program voltage to the second memory transistor for programming the second memory transistor to a second logic state of the second set of logic states;
  a third program step of applying a third program voltage to the third memory transistor for programming the third memory transistor to a third logic state of the second set of logic states;
  a second verify step of applying a second target verification voltage to the second memory transistor for verifying that the second memory transistor is programmed to the second logic state of the second set of logic states, and
  wherein the second verify step comprises applying the second target verification voltage to the third memory transistor for using the second target verification voltage as a pre-verification voltage for the third memory transistor.

16. The method of claim 15, wherein the first program voltage is higher than the second program voltage.

17. The method of claim 15, wherein the second logic state of the second set of logic states is a program state having threshold voltages lower than that of the third logic state of the second set of logic states.

18. The method of claim 15, Wherein the second program step and the second verify step constitute a program loop, and the second memory transistor is programmed by repeating the program loop.

19. The method of claim 18, wherein if a selected memory transistor is judged as an ON cell by applying the pre-verification voltage and as program fail by applying the target verification voltage at a previous program loop, then a voltage higher than a ground voltage is applied to the bit line of the selected memory transistor while a program voltage is applied to the selected memory transistor.

* * * * *